United States Patent
Soeda

(10) Patent No.: US 8,299,430 B2
(45) Date of Patent: Oct. 30, 2012

(54) ELECTRON MICROSCOPE AND OBSERVATION METHOD

(75) Inventor: Takeshi Soeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 12/501,672

(22) Filed: Jul. 13, 2009

(65) Prior Publication Data

US 2009/0272902 A1 Nov. 5, 2009

Related U.S. Application Data

(63) Continuation of application No. PCT/JP2007/052850, filed on Feb. 16, 2007.

(51) Int. Cl.
*H01J 37/26* (2006.01)
*G01N 23/00* (2006.01)
(52) U.S. Cl. ............... 250/305; 250/307; 250/311
(58) Field of Classification Search ........ 250/305–307, 250/311
See application file for complete search history.

(56) References Cited

U.S. PATENT DOCUMENTS

| | | | |
|---|---|---|---|
| 5,981,948 A | 11/1999 | Taniguchi et al. | |
| 7,084,400 B2 * | 8/2006 | Soeda | 250/311 |
| 7,154,092 B2 * | 12/2006 | Furukawa | 250/311 |
| 2004/0000641 A1 * | 1/2004 | Taniguchi et al. | 250/311 |
| 2004/0188608 A1 * | 9/2004 | Kaneyama | 250/305 |
| 2005/0082477 A1 | 4/2005 | Soeda | |
| 2006/0011836 A1 * | 1/2006 | Kaji et al. | 250/310 |
| 2006/0038127 A1 | 2/2006 | Furukawa | |

FOREIGN PATENT DOCUMENTS

| | | | |
|---|---|---|---|
| JP | H-07-296758 A | 11/1995 |
| JP | 9-119907 A | 5/1997 |
| JP | 2001266783 A | 9/2001 |
| JP | 2003-249186 A | 9/2003 |
| JP | 2004-227942 A | 8/2004 |
| JP | 2005-121552 A | 5/2005 |
| JP | 2006-12863 A | 1/2006 |
| JP | 2006-59687 A | 3/2006 |

OTHER PUBLICATIONS

Van Benthem, et. al. "Three Dimensional ADF Imaging of Individual Atoms by Through-Focal Series Scanning Transmission Electron Microscopy", Ultramicroscopy 106 (2006) 1062-1068.*
van Benthem, et. al. "Three-Dimensional ADF Imaging of Individual Atoms by Through-Focal Series Scanning Transmission Electron Microscopy", Ultramicroscopy 106 (2006) 1062-1068.*
International Search Report of PCT/JP2007/052850, Mailing Date of May 15, 2007.
"Japanese Office Action" mailed by JPO and corresponding to Japanese application No. 2008-557958 on Oct. 25, 2011, with partial English translation.

* cited by examiner

*Primary Examiner* — Robert Kim
*Assistant Examiner* — David E Smith
(74) *Attorney, Agent, or Firm* — Fujitsu Patent Center

(57) ABSTRACT

An electron microscope includes an electron gun for generating an electron beam, an accelerator for accelerating the electron beam to apply the electron beam to a sample, a spectroscope for selecting electrons having a specific energy out of the electron beam transmitted through the sample and losing an energy by an interaction with the sample, and a detector for detecting the electrons of the specific energy selected by the spectroscope and giving a transmission signal or a diffraction signal at a depth of the sample corresponding to a lost energy quantity of the electrons.

8 Claims, 8 Drawing Sheets

ELECTRON MICROSCOPE AND OBSERVATION METHOD

CROSS-REFERENCE TO RELATED APPLICATIONS

This application is a Continuation of International Application No. PCT/JP2007/052850, with an international filing date of Feb. 16, 2007, which designating the United States of America, the entire contents of which are incorporated herein by reference.

FIELD

The embodiments discussed herein are related to an electron microscope and an observation method using the electron microscope.

BACKGROUND

With the recent downsizing of electronic devices, the technique of evaluating the device structures is also required to have high precision. Among the evaluation techniques, especially TEM (Transmission electron Microscope) and STEM (Scanning Transmission Electron Microscope), which can focus electron beams up to the nanometer order, are effective for the high precision observation and analysis. However, these means give only projected images of three dimensional device structures, i.e., two dimensional information and cannot give information in the direction of advance of the electrons (the direction of depth of sample).

In such present circumstances, in order to generally evaluate electronic device structures having three dimensional structures, the technique of observing the samples in different sections, and the technique of three-dimensionally adjoining images observed in multi-directions (electron beam tomography), etc. are used. The former has disadvantages that a plural numbers of a sample are required, and the section makes the amount of information imperfect. The latter has disadvantages that a sample must be sectioned with a target object positioned at the center, which makes the processing time long and makes the amount of information lack.

On the other hand, techniques other than TEM are the confocal laser scanning microscopy, and the technique that the SEM (scanning electron microscopy) observation is made with focused ion beams while the processing is being made to thereby adjoin a three-dimensional structure. But these techniques are inferior to TEM and STEM in the image resolving power and are difficult to be used in evaluating fine structures.

Generally, when the universal TEM and STEM, which use the acceleration energy of about 200 kV, are used, the evaluation samples are processed in a thickness of not more than about 200 nm. This is because as the evaluation samples are thicker, the interactions between the incident electrons and the materials increase, and the incident energy is liable to be lost. The electrons which have thus lost the energy is a factor of focal blur, of the TEM images and the STEM images, and when a sample of, e.g., a micron order thickness is observed with the universal TEM and STEM described above, the images are blurred.

The electric devices have various structures and sizes, and when an evaluation sample has a thickness of the micron order, there is a risk that unnecessary information might be mixed. Such information corresponds to the information of, e.g., the insulting regions in evaluating the device regions, and the information of, e.g., the inter-layer insulating films and cover films, etc. in evaluating the interconnections. Similarly, the support films, the packing materials, etc. used in reinforcing the samples of TEM and STEM, which are irrelevant to the observation and analysis, idealistically do not function as the purposes other than the purpose of securing the mechanical strength. However, the interactions between these materials and the incident electrons cannot be hindered.

As described above, conventionally, no means of evaluating generally and with high precision the electronic device structures of three-dimensional structures have been available. For further downsizing of the electronic devices, a technique which can evaluate generally and with high precision electronic device structures, etc. of three-dimensional structures has been expected.

SUMMARY

According to one aspect of embodiments, there is provided an electron microscope includes an electron gun for generating an electron beam, an accelerator for accelerating the electron beam and applying the electron beam to a sample, a spectroscope for selecting electrons having a specific energy out of the electron beam transmitted through the sample and losing energy by an interaction with the sample, and a detector for detecting the electrons of the specific energy selected by the spectroscope and giving a transmission signal or a diffraction signal at a depth of the sample corresponding to a lost energy quantity of the electrons.

According to another aspect of embodiments, there is provided an electron microscope includes an electron gun for generating an electron beam, an accelerator for accelerating the electron beam to a prescribed acceleration voltage and applying the electron beam to a sample, a detector for detecting the electron beam transmitted through the sample, and a controller for controlling a focal position of the electron beam in the sample with the acceleration voltage of the electron beam.

According to further another aspect of embodiments, there is provided an observation method of an electron microscope includes applying an electron beam to a sample, detecting selectively electrons having a specific energy out of the electron beam transmitted through the sample and losing energy due to an interaction with the sample, and obtaining a transmission image or a diffraction image at a depth of the sample corresponding to a lost energy quantity of the detected electrons.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

The electron microscope and the observation method according to an embodiment will be explained with reference to FIGS. 1 to 7.

Figure 1:
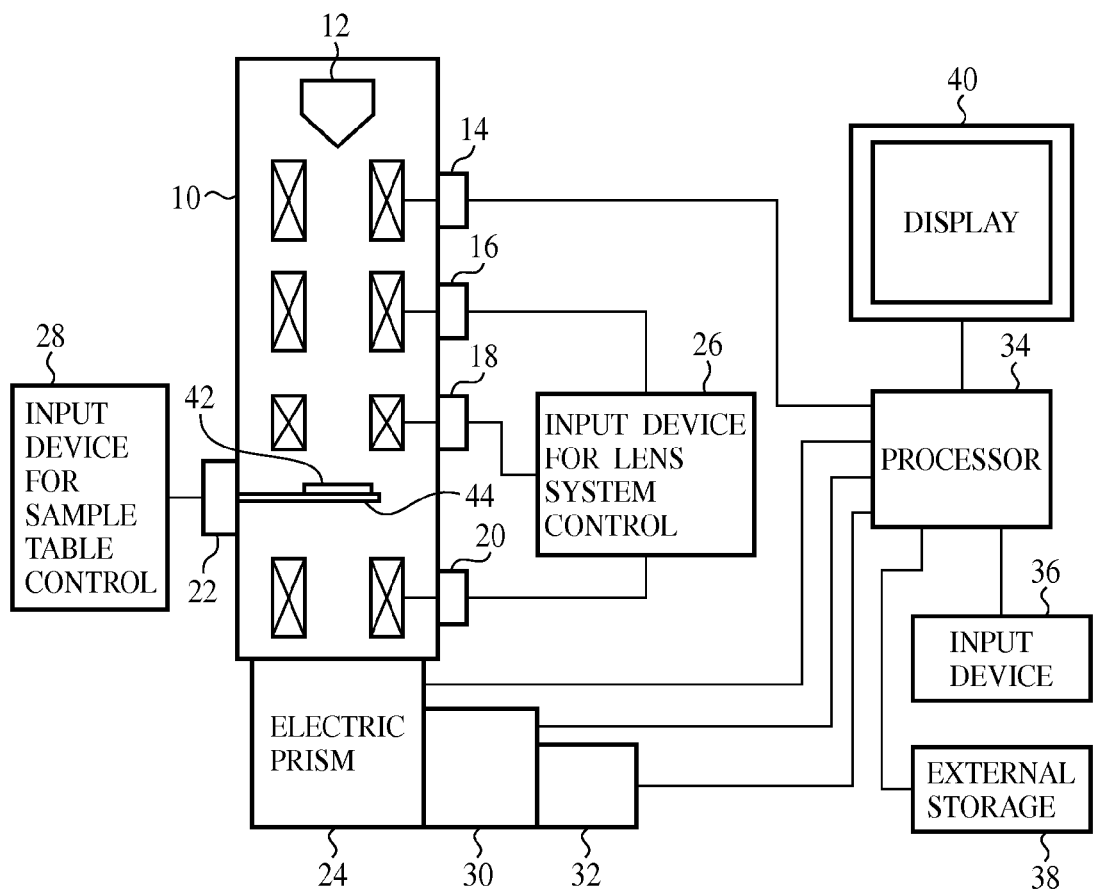
FIGS. 1 and 2 are schematic diagrams illustrating the structure of the electron microscope according to an embodiment.
Figure 2:
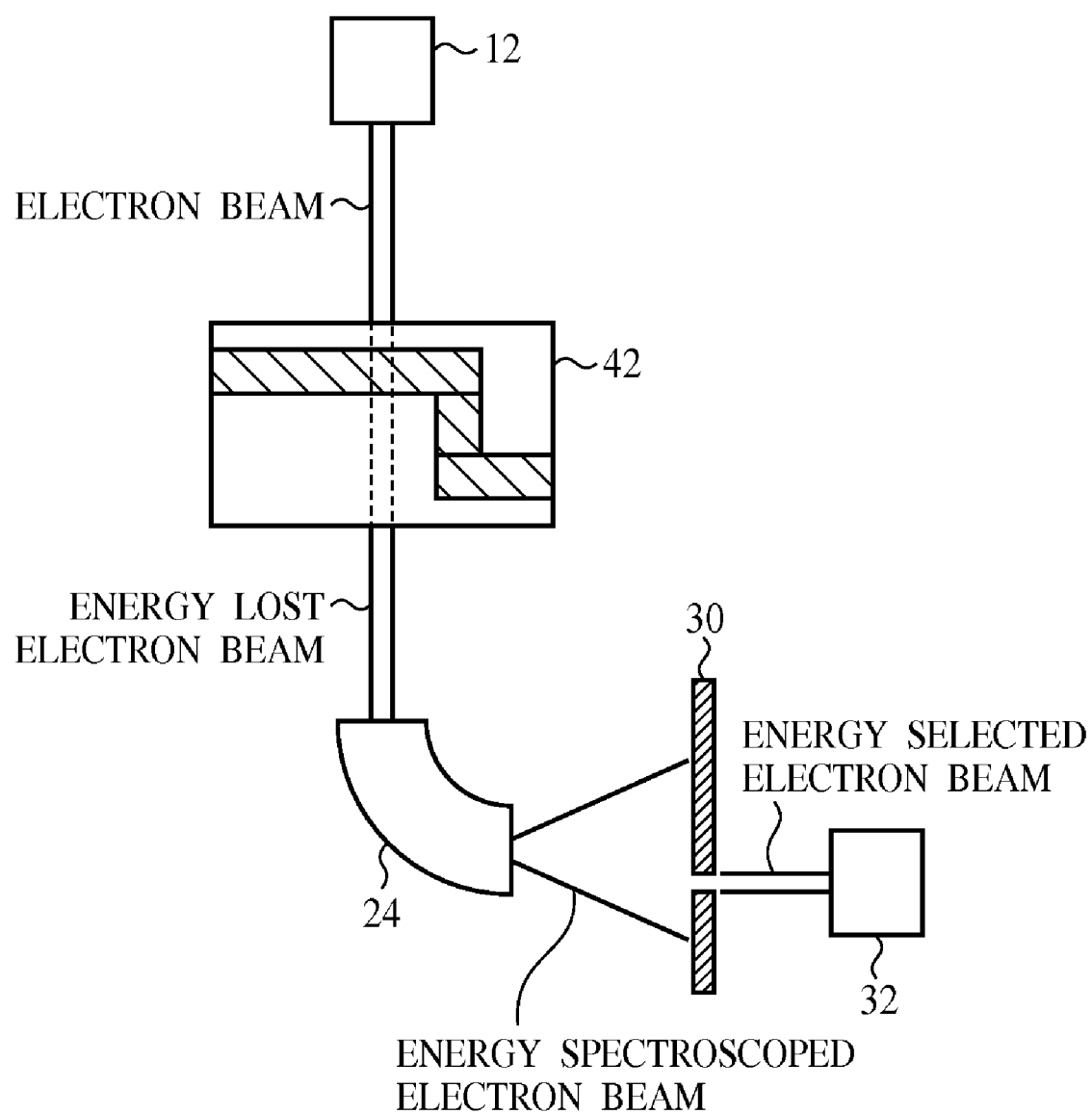
Figure 3:
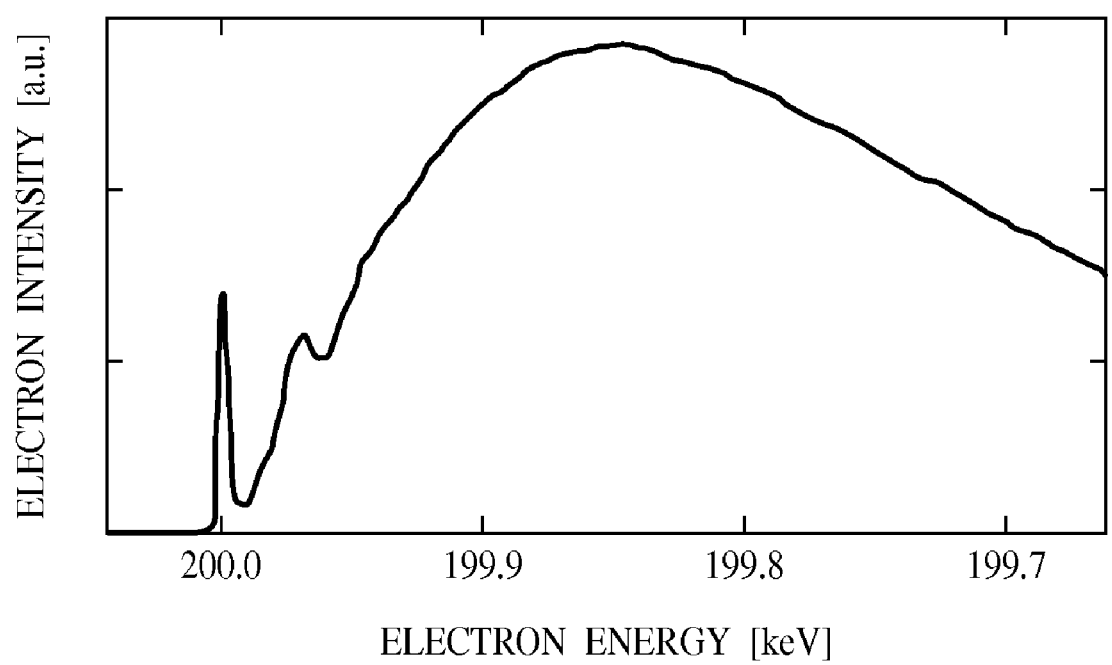
FIG. 3 is a graph of an energy loss spectrum of the electron beams transmitted through a sample.
Figure 4:
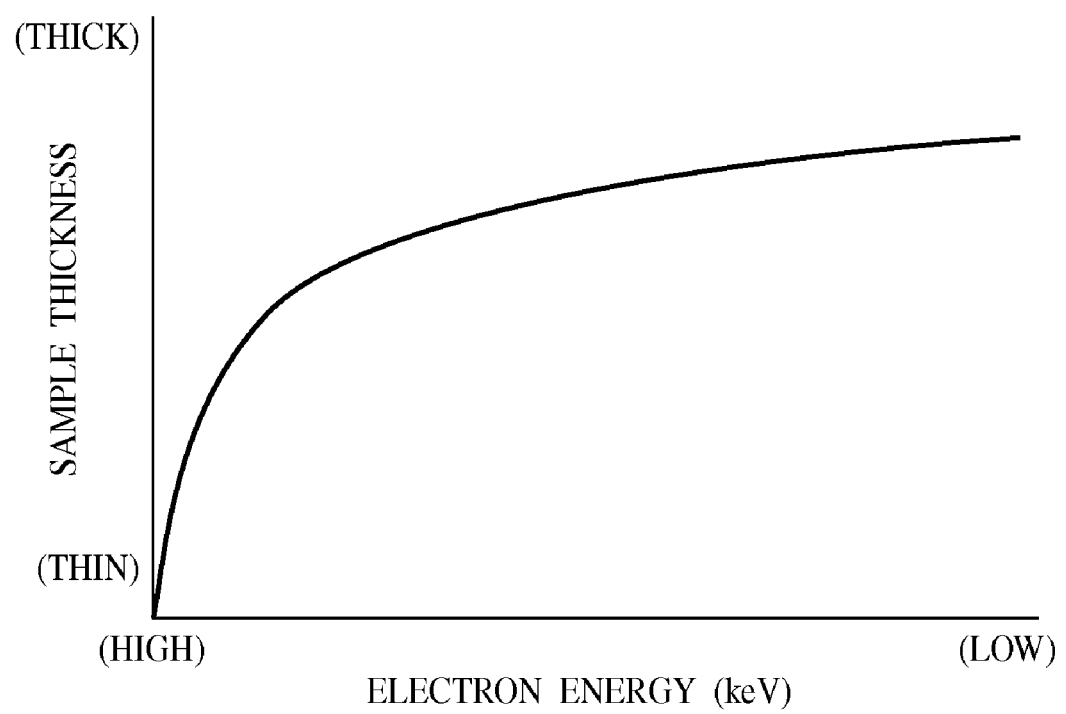
FIG. 4 is a graph of relationships between the thickness of the sample and the electron energy of the electron beams transmitted through the sample.
Figure 5A:
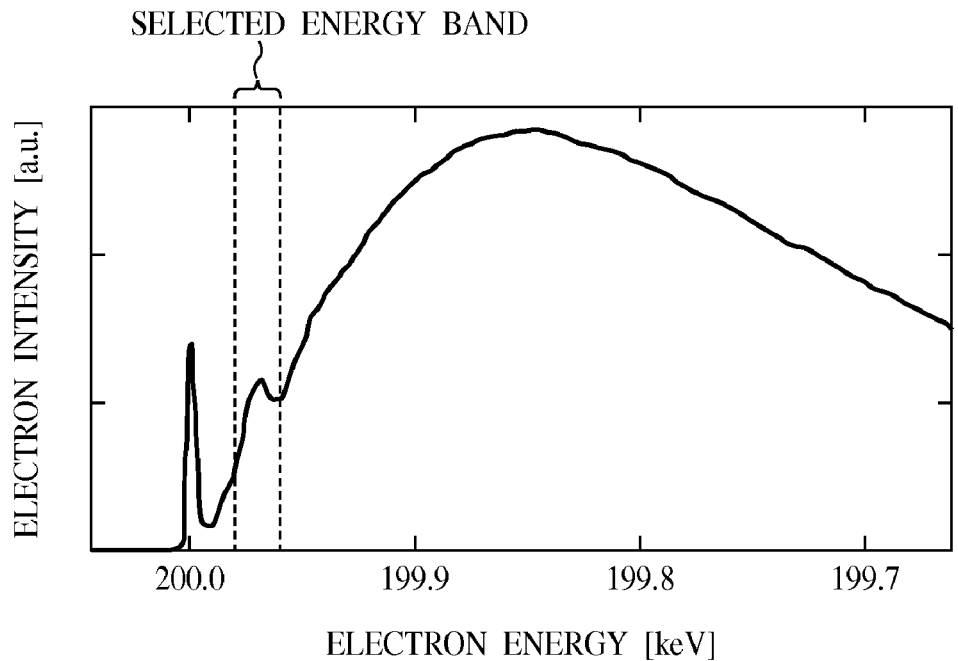
FIG. 5A is a graph of energy loss spectrum with a voltage corresponding to a lost energy to the acceleration voltage.
Figure 5B:
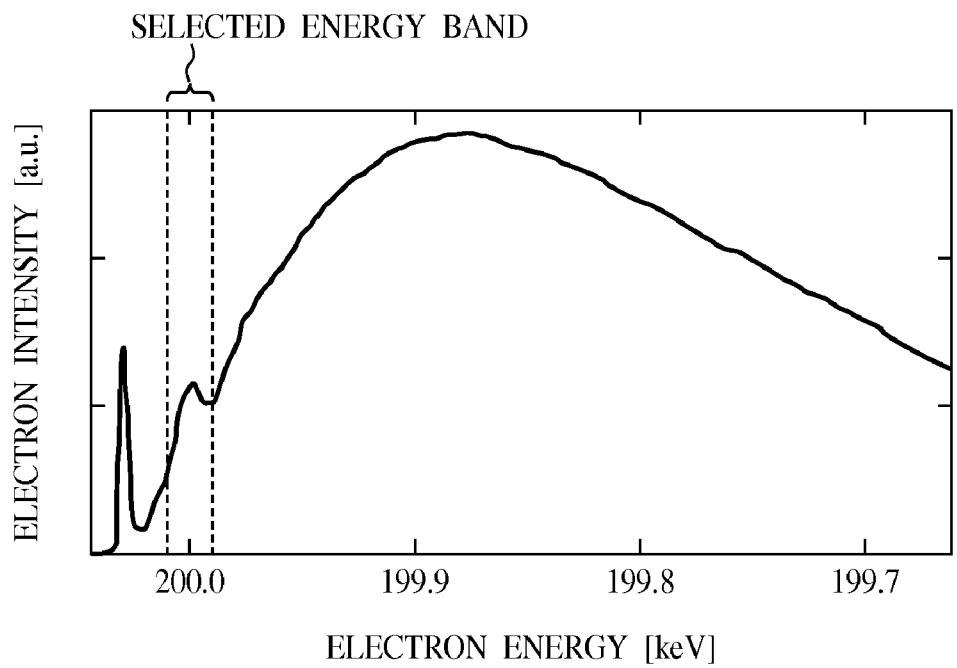
FIG. 5B is a graph of energy loss spectrum without a voltage corresponding to a lost energy to the acceleration voltage.
Figure 6:
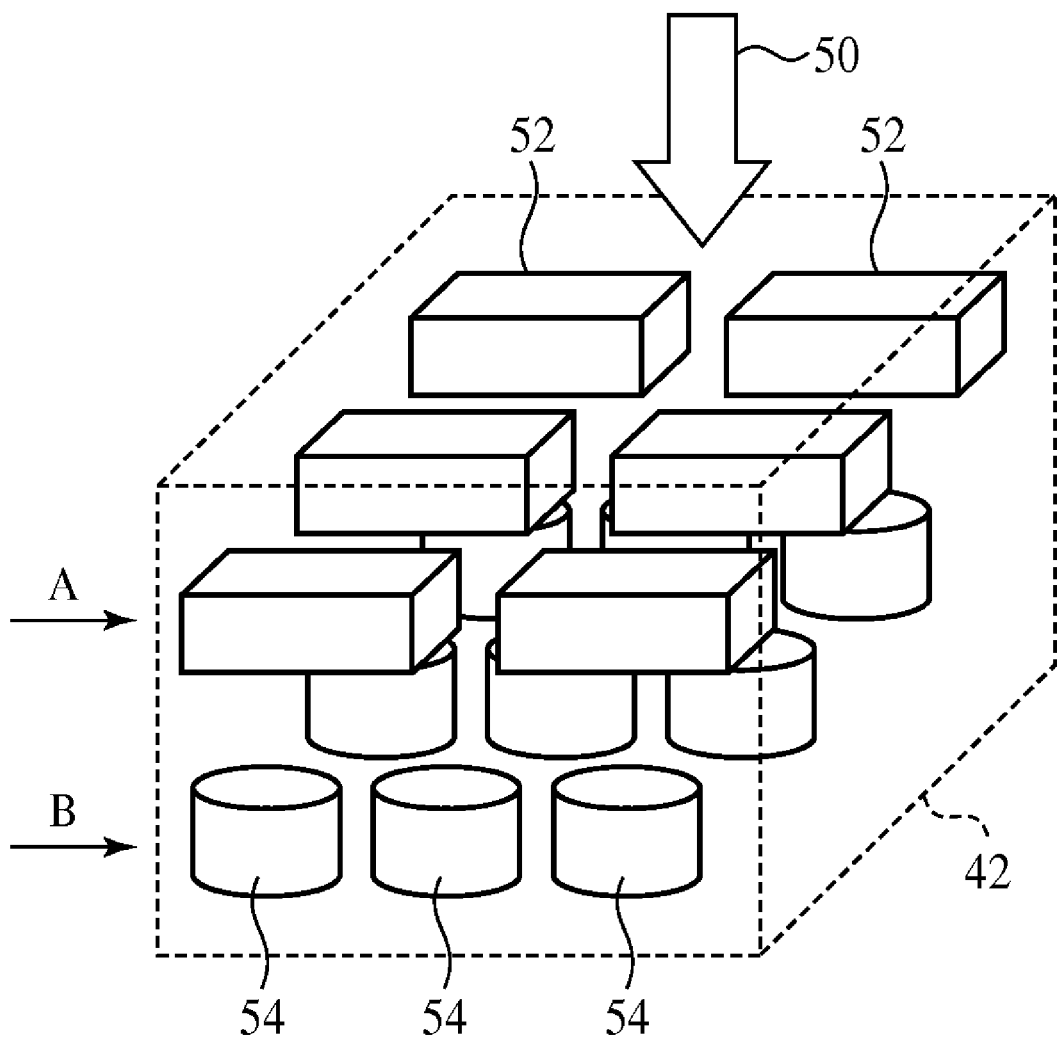
FIG. 6 is a diagrammatic view illustrating a model of the sample to be measured.
Figure 7A:
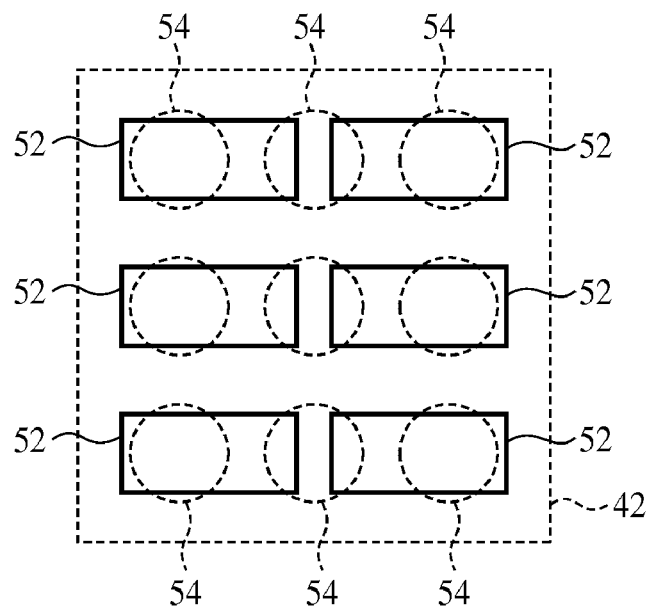
FIGS. 7A and 7B are diagrammatic views illustrating examples of the measurement of the sample of FIG. 6.
Figure 7B:
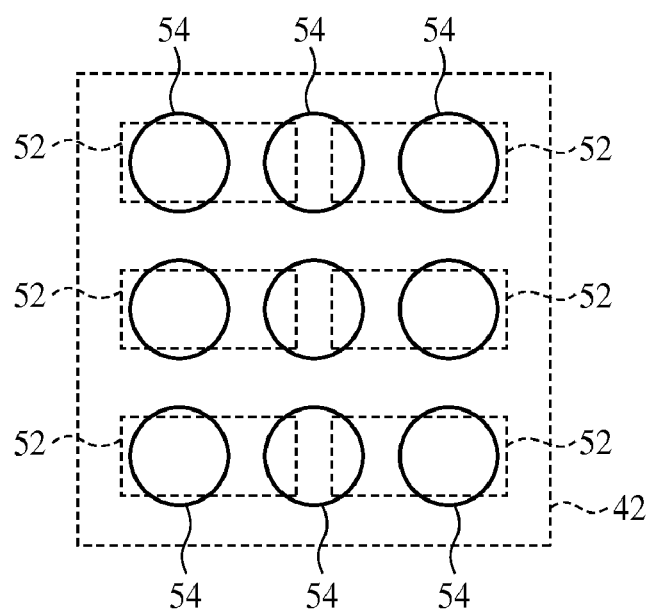

FIGS. 1 and 2 are schematic diagrams illustrating the structure of the electron microscope according to the present embodiment. FIG. 3 is a graph of an energy loss spectrum of the electron beams transmitted through a sample. FIG. 4 is a graph of relationships between the thickness of the sample and the electron energy of the electron beams transmitted through the sample. FIGS. 5A and 5B are graphs of energy loss spectrum with and without a voltage corresponding to a lost energy to the acceleration voltage. FIG. 6 is a diagrammatic view illustrating a model of the sample to be measured. FIGS. 7A and 7B are diagrammatic views illustrating examples of the measurement of the sample of FIG. 6.

First, the structure of the electron microscope according to the present embodiment will be explained with reference to FIGS. 1 and 2.

As illustrated in FIG. 1, a tube 10 forming an electron beam optical system includes, for example, an electron gun 12 for generating electron beam, an acceleration voltage controller 14 for controlling the acceleration voltage of the electron beam generated by the electron gun, a convergent lens system controller 16 for converging the electron beam to apply the electron beam to a sample, a scanning lens controller 18 for scanning the electron beam to be applied to the sample, an image formation lens system controller 20 for controlling the image formation lens system for forming an image of the electron beam transmitted through the sample, a sample table controller 22 for controlling the position of the sample with respect to the electron beam, and an electric prism 24 for dispersing the electron beam transmitted through the sample corresponding to energies thereof.

The convergent lens system controller 16 and the image forming lens system controller 20 may be connected to an input device for lens system control 26 for inputting information for controlling the respective lens systems. The sample table controller 22 may be connected to an input device for sample table control 28 for inputting information for controlling the sample table.

On the output side of the electric prism 24, a detector 32, such as a CCD camera, an STEM detector or others, is disposed via an energy selective diaphragm 30. The energy selective diaphragm 30 selectively transmits to the detector 32 the electron beam of energies in a prescribed range, which have passed the electric prism 24. In this specification, the electric prism 24 and the energy selective diaphragm 30 are called a spectroscope as a whole in some cases.

A processor 34 may be connected to the acceleration voltage controller 14, the energy selective diaphragm 30 and the detector 32. The processor 34 may function as a controller for controlling the acceleration voltage controller 14, the convergent lens system controller 16, the image forming lens system controller 20, the sample table controller 22, the energy selective diaphragm 30, etc. and also as an analyzer for analyzing measured data inputted by the detector 32.

To the processor 34, an input device 36 for inputting from the outside information necessary for the measurement, etc., an external storage 38 for storing data base, etc. to be used in the measured data, a display 40 for displaying the analysis results, etc., and others may be connected.

As described above, the electron microscope according to the preset embodiment is an electron microscope basically having the STEM function. The electron microscope according to the present embodiment includes the electric prism 24 for spectroscoping the electron beam which have passed a sample, the energy selective diaphragm 30 which selectively transmits electron beam of the electron beam spectroscoped by the electric prism 24, which are in a prescribed energy range are disposed before the detector 32.

The basic structure of the electron microscope may be STEM or TEM. In this case, the scanning lens system (the scanning lens controller 18, etc.) is unnecessary.

Next, the observation method using the electron microscope according to the present embodiment will be explained with reference to FIGS. 1 and 2.

A sample 42 to be evaluated is prepared and is mounted on the sample table 44 in the tube 10. In the observation method according to the present embodiment, the sample 42 can have a film thickness of not less than 1 μm, which is acknowledged to be too thick for the measurement of the ordinary TEM and STEM, e.g., about 1.5 μm.

Then, the electrons emitted from the electron gun 12 are accelerated by the acceleration voltage controller 14 with the acceleration voltage used in the universal TEM or STEM, e.g., 100-200 kV to prepare electron beam. To suppress damages to the sample 42, preferably, the acceleration voltage is not more than about 200 kV, which is used in the universal TEM, etc. An acceleration voltage of more than about 200 kV, e.g., about 1 MV may be also used.

Next, the position of the sample table 44 is controlled via the input device for sample table control 28 and the sample table controller 22 to adjust the inclination angle and the eucentric of the sample 42 with respect to the electron beam. Thus, the conditions that a bright (dark) field STEM image or a bright (dark) field TEM image of a concerned region of the sample 42 can be given is prepared.

Next, the electron beam is applied to the sample 42. The electron beam transmitted through the sample 42 pass through the electric prism 24, and an energy loss spectra is given.

The electron beam transmitted through the sample 42 have been variously scattered in the sample 42 and have various energies. Such electrons are generally called here energy lost electrons. An electric field is applied to the electron beam, whereby the electrons are influenced by the Lorenz force and are deflected corresponding to the energies of the respective electrons. That is, the electrons having larger energy losses have large deflection angles, and the electrons having smaller energy losses have smaller deflection angels (see FIG. 2). The device for energy-spectroscoping the electron beam by applying electric field has such principle, which is very similar to the prism which deviates wavelengths of light, and is called an electric prism.

FIG. 3 is a graph of one example of the relationships between the electron intensity and the electron energy of the electron beam spectroscoped by the electric prism 24 (energy loss spectrum). The horizontal axis indicates the energies given by subtracting lost energies from the incident energy (acceleration energy), i.e., electron energies transmitted through the sample 42.

Next, the electron beam which have passed the electric prism 24 is introduced into the energy selective diaphragm 30 (see FIG. 2). The electron beam spectroscoped by the electric prism 24 have larger deflection angles as they have larger energy losses and have smaller deflection angles as they have smaller energy losses. Accordingly, a diaphragm having a slit (the energy selective diaphragm 30) at a position corresponding to a prescribed deflection angle is disposed, whereby electron beam of an arbitrary energy can be selectively taken out.

Then, the electron beam of the arbitrary energies, which have passed the energy selective diaphragm 30 is detected by the detector 32.

The defocus of TEM and STEM is due to energy shifts, i.e., chromatic aberration. The defocus can be reduced by narrowing the range of the electron energies contributing to focusing. This effect is more conspicuous in TEM than in STEM. This is because in TEM, even after electrons have passed a sample, magnifying operation is made by multistage lens block, which makes the chromatic aberration influential.

When electrons are incident on the support films, the packing materials for increasing the strength of a sample, or the cover films, etc. used in many of the device structures, the electron energy have the correlationships with the film thickness as exemplified in FIG. 4. That is, the horizontal axis of the spectrum of FIG. 4 is the function of the thickness of a sample.

The thickness of a sample here means an intrusion distance of electrons from the sample surface. Accordingly, the electron beam of an arbitrary energy band is selected by the energy selective diaphragm 30, whereby a focus position can be set at an arbitrary depth of a sample. That is, an energy band corresponding to a depth of the sample 42 to be observed is selected by the energy selective diaphragm 30 to make image observation, whereby sharp image which is less defocused at the arbitrary depth of the sample 42 can be obtained.

As a sample is thicker, the electrons tend to have interactions, and the intensity of energy lost electrons is increased. Accompanying this, electron signals to be applied to the detector of TEM or STEM are increased, which resultantly is advantageous for the observation and analysis of thick samples.

In the universal electron microscope, the lens conditions are designed so that the optical performance of electrons of a specific acceleration energy of, e.g., 120 keV, 200 keV or others can be given to the max. The acceleration energy is specific to each electron microscope and is called a rated acceleration energy. The rated acceleration energy is, in other words, an acceleration energy which can draw out to the max the optical performance of the electron microscope.

Accordingly, all the electrons whose lost energy quantity is not zero are not optimum to the lens conditions in terms of the energy. Also the energy lost electrons transmitted through a sample can be condensed by a multistage lens. The lens conditions, however, are not optimum, and the resolving power does not reach the resolving power given by the electron beam of the rated acceleration energy. Impractically, every time the acceleration energy is changed, the lens conditions are adjusted, which takes time.

Then, in the observation method according to the present embodiment, a voltage corresponding to a lost energy quantity is supplied to the acceleration energy, whereby optimum lens conditions can be maintained. Specifically, an acceleration energy of the electron beam is given by adding a voltage corresponding to a lost energy of the transmitted electron beam so that the electron energy of the transmitted electron beam which have lost an energy corresponding to a depth of an object-to-be-observed becomes the rated acceleration energy of the microscope.

For example, in the electron microscope whose rated acceleration voltage is 200 kV, when the electron energy of the transmitted electron beam corresponding to a position-to-be-focused (an intrusion depth in the sample 42) has been lost by 199.97 keV (the electrons have lost the energy by 0.03 keV in the sample 42) as exemplified in FIG. 5A), the energy of 0.03 keV corresponding to the loss due to the sample 42 is added to thereby raise the acceleration voltage to 200.03 kV. The addition to the acceleration energy here means the energy loss spectrum of FIG. 3 is shifted to the high energy side. Thus, the electron energy of the transmitted electron beam corresponding to a position-to-be-focused is 200.0 keV as exemplified in FIG. 5B, and the image observation can be made under the optimum lens conditions for the electron microscope without adjusting the lens system.

The energy selective diaphragm 30 at this time may have a selected energy band set so as to pass selectively the electron beam whose lost energy is near zero (the electron beam whose acceleration energy agrees with the rated acceleration energy of the microscope). That is, when the structure of the sample 42 is observed depth-wise, the energy band of the electron beam selectively passed by the energy selective diaphragm 30 is set near the rated acceleration energy of the electron microscope, and the acceleration energy of the electron beam is increased by the acceleration voltage controller 14 corresponding to a depth of the sample 42, which is to be observed.

The sample 42 is thus observed, whereby sharp images which are little defocused can be obtained at arbitrary depth of the sample 42.

The focus position in the sample 42 may be controlled by an objective lens. In this case, the lens conditions are not optimum in terms of the energy, the resolving power is inferior to the resolving power given by controlling the acceleration voltage.

FIG. 6 is a diagrammatic view illustrating one example of the sample 42. The sample 42 illustrated in FIG. 6, includes rectangular parallelepiped structures 52 formed at a position of a depth A, and cylindrical structures 54 formed at a position of a depth B.

For the sample illustrated in FIG. 6, when electron beam 50 is incident, and the acceleration energy of the electron beam is controlled so that the electron energy of the transmitted electron beam corresponding to the depth A becomes a rated acceleration energy of the electron microscope, the image exemplified in FIG. 7A is given. That is, the image of the sharp images of the structures 52 and the blurred images of the structures 54 overlapping each other can be given. When the acceleration energy of the electron beam is controlled so that the electron energy of the transmitted electron beam corresponding to the depth B becomes the rated acceleration energy of the electron microscope, the image exemplified in FIG. 7B is given. That is, the image of the sharp image of the structures 54 and the blurred images of the structures 52 overlapping each other can be given. The image processing for extracting the sharp images out of these images is made to thereby separate the depth-wise information of the sample 42.

As described above, according to the present embodiment, the electron beam of an arbitrary energy band are selected to form images, whereby sharp image of the sample, which are less defocused can be given at arbitrary depths-to-be-observed. The acceleration energy of electron beam to be applied to the sample is approximated to the rated acceleration energy of the microscope by increasing the acceleration energy by a lost energy of the electron beam transmitted through the sample, whereby the image observation can be made under optimum lens conditions. Thus, sharp images which are less defocused can be given.

Modified Embodiments

The above-described embodiment can cover other various modifications.

For example, in the above-described embodiment, the electron beam transmitted through the sample 42 is introduced into the detector 32 via the electric prism 24 and the energy selective diaphragm 30. However, the electric prism 24 and the energy selective diaphragm 30 are not essential.

In STEM, in which no magnifying lens is disposed after electron beam has been transmitted by the sample 42, as is in TEM, the chromatic aberration is less influential in comparison with the chromatic aberration in TEM. Accordingly, even when the electron beam transmitted through the sample 42 are detected directly by the detector 32, better images than images given by TEM can be obtained. In STEM as well, an energy band of the electron beam is focused with the electric prism 24 and the energy selective diaphragm 30 as described in the above-described embodiment, whereby the effect of removing blur of images is higher.

Figure 8:
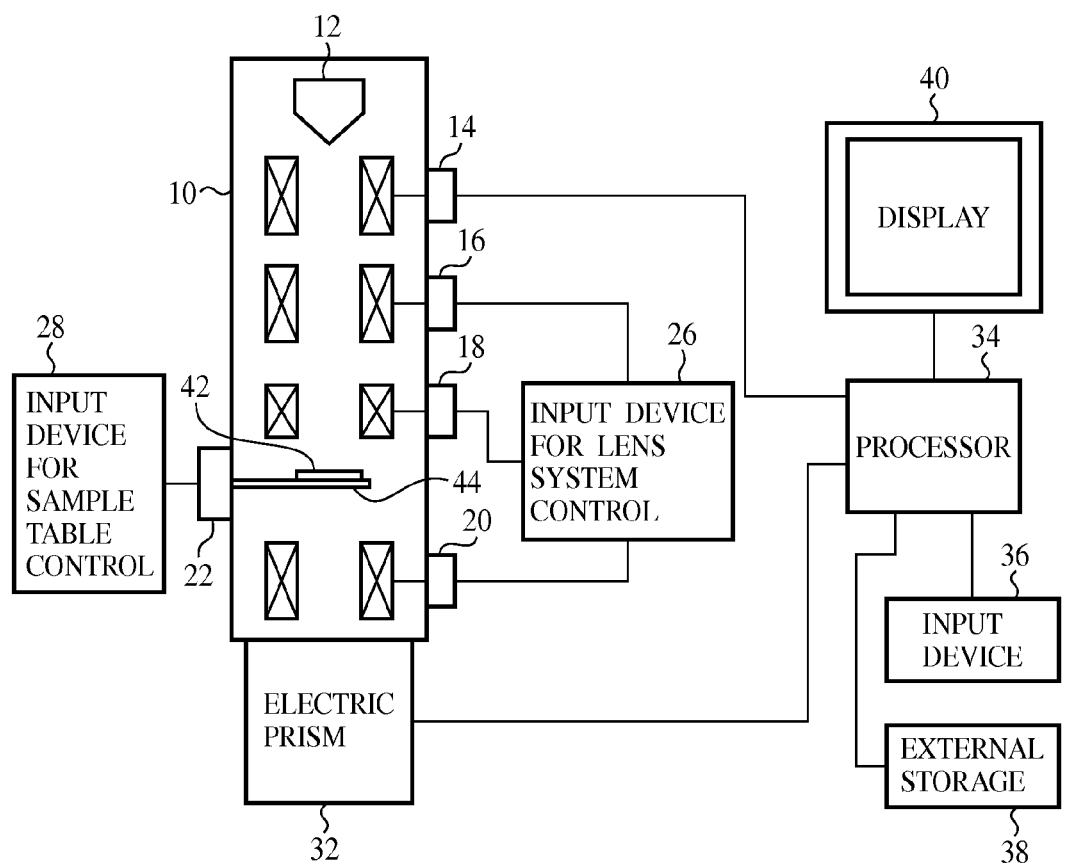
FIG. 8 is a schematic diagram illustrating the structure of the electron microscope according to a modification of the embodiment.

The electron microscope which does not include the electric prism 24 and the energy selective diaphragm 30 can have the structure exemplified in FIG. 8.

The voltage boost width of the acceleration energy of the electron beam is made small, whereby a shift of the focus position is decreased. The focus position is thus shifted continuously to thereby obtain slice images of different thicknesses under the respective conditions, and the slice images are subjected to inter-computation by known techniques to thereby obtain three dimensional images.

The above-described embodiment has been explained by means of a thick sample of an above 1 μm-thickness. However, the observation method according to the embodiment is applicable to the measurement of not more than about 0.3 μm thickness-samples, which are used in the ordinary TEM and STEM. When a sample is so thin, the probability of the energy loss lowers, and in comparison with thick samples, the energy dispersion width becomes smaller with respect to an energy selected width. The observation method according to the embodiment is applied to such case, whereby focusing is enabled at all thicknesses. Electrons tend to lose energy as a sample is thicker, but a small number of electrons do not lose energy for a thickness of, e.g., not more than 0.3 μm. When a selected energy value is the rated 200 kV, focusing can be made in all regions from the sample surface to the underside. The signal-to-noise (S/N) ratio is better toward the surface and worse toward the underside. Similarly, when the energy other than 200 keV is selected, focusing can be made in all regions. The selected energy is varied, whereby the maximum value of the S/N ratio can be controlled depth-wise. When a sample has a thickness of not less than 1 μm, the energy dispersion width becomes sufficiently large with respect to a selected energy width, whereby focusing may not be made in a sample anywhere.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electron microscope comprising:
   an electron gun configured to generate an electron beam;
   an accelerator configured to accelerate the electron beam and to apply the electron beam to a sample;
   a controller configured to control an acceleration energy of the electron beam to be applied to the sample so that a focal position of the electron beam agrees with a depth of a region to be measured of the sample; and
   a detector configured to detect selectively electrons losing a specific energy corresponding to the depth of the region to be measured of the sample out of the electron beam transmitted through the sample and losing energy due to an interaction with the sample to obtain a transmission image or a diffraction image of the electrons at the depth of the region to be measured of the sample, wherein
   the controller is configured to control the acceleration energy of the electron beam to be applied to the sample so that energy of the electrons losing the specific energy agrees with a rated acceleration energy.

2. The electron microscope according to claim 1, further comprising:
   a scanning lens configured to scan the electron beam accelerated by the accelerator over the sample.

3. The electron microscope according to claim 1, further comprising:
   an image forming lens configured to magnify or reduce with a multistage lens the electron beam transmitted through the sample.

4. The electron microscope according to claim 1, further comprising:
   a scanning lens configured to scan the electron beam accelerated by the accelerator over the sample.

5. The electron microscope according to claim 1, further comprising:
   an image forming lens configured to magnify or reduce with a multistage lens the electron beam transmitted through the sample.

6. An observation method of an electron microscope comprising:
   controlling an acceleration energy of an electron beam to be applied to a sample so that a focal position of the electron beam agrees with a depth of a region to be measured of the sample to apply the electron beam to the sample;
   detecting selectively electrons losing a specific energy corresponding to the depth of the region to be measured of the sample out of the electron beam transmitted through the sample and losing energy due to an interaction with the sample; and
   obtaining a transmission image or a diffraction image of the electrons at the depth of the region to be measured of the sample, wherein
   the acceleration energy of the electron beam to be applied to the sample is set so that energy of the electrons losing the specific energy agrees with a rated acceleration enemy of the electron microscope.

7. The observation method according to claim 6, wherein slice images at different depths are obtained by shifting a thickness-wise focal position of the sample, and a three dimensional image is obtained by inter-computing the slice images.

8. The electron microscope according to claim 1, further comprising:
   a spectroscope configured to select electrons losing a specific energy corresponding to the depth of the region to be measured of the sample out of the electron beam transmitted through the sample and losing energy by an interaction with the sample, wherein
   the detector detects selectively the electrons losing the specific energy selected by the spectroscope to obtain the transmission image or the diffraction image of the electrons at the depth of the region to be measured of the sample.

* * * * *